US006118987A

United States Patent [19]

Hiramatsu et al.

[11] Patent Number: 6,118,987

[45] Date of Patent: Sep. 12, 2000

[54] RADIO TRANSMITTING APPARATUS AND GAIN CONTROL METHOD FOR THE SAME BASED ON COMPLEX WEIGHT COEFFICIENTS AND MODULATION PRECISION CHARACTERISTICS

[75] Inventors: Katsuhiko Hiramatsu, Yokohama; Kazuyuki Miya, Kawasaki, both of Japan

[73] Assignee: Matsushita Electric Industrial Co., Ltd., Osaka, Japan

[21] Appl. No.: 09/044,174

[22] Filed: Mar. 19, 1998

[30] Foreign Application Priority Data

Mar. 25, 1997 [JP] Japan .................................... 9-090306

[51] Int. Cl.[7] .............................. H03C 1/52; H04L 27/36

[52] U.S. Cl. .......................... 455/108; 455/126; 375/298; 375/300

[58] Field of Search .................................... 455/102, 126, 455/522, 562, 69, 116, 108, 106; 370/208, 203; 375/206, 200, 260, 261, 298, 300; 330/129; 342/361

[56] References Cited

U.S. PATENT DOCUMENTS

| | | | |
|---|---|---|---|
| 4,199,723 | 4/1980 | Cummings et al. | 455/126 |
| 5,396,256 | 3/1995 | Chiba et al. | 342/157 |
| 5,473,333 | 12/1995 | Chiba et al. | 342/157 |
| 5,835,488 | 11/1998 | Sugita | 375/206 |
| 5,862,460 | 1/1999 | Rich | 455/126 |

*Primary Examiner*—Edward F. Urban
*Assistant Examiner*—Rafael Perez-Gutierrez
*Attorney, Agent, or Firm*—Greenblum & Bernstein, P.L.C.

[57] ABSTRACT

Gain control is performed on an input signal to an orthogonal modulator used in a radio transmitting apparatus in such a manner that the level of the input signal falls within the proper operation range of the orthogonal modulator. At the time of amplifying and outputting the output of the orthogonal modulator, gain control is executed with the reciprocal of a control gain for the input signal to the orthogonal modulator. Accordingly, the input to the orthogonal modulator of an adaptive array antenna can be compensated within the proper range to ensure the proper operation of the orthogonal modulator.

13 Claims, 8 Drawing Sheets

PRIOR ART

PRIOR ART

RADIO TRANSMITTING APPARATUS AND GAIN CONTROL METHOD FOR THE SAME BASED ON COMPLEX WEIGHT COEFFICIENTS AND MODULATION PRECISION CHARACTERISTICS

BACKGROUND OF THE INVENTION

1. Field of the Invention

The present invention relates to a radio transmitting apparatus which transmits signals to an adaptive array antenna, and a gain control method for the radio transmitting apparatus.

2. Description of the Related Art

An adaptive array antenna transmitting apparatus, which is well known as a radio transmitting apparatus, carries out transmission with directivity by transmitting the same signal from a plurality of antennae while changing the amplitude and phase of the signal. The process for altering the amplitude and phase can be accomplished by perform multiplication on an analog signal or by perform multiplication on a digital signal. Because the process on a digital signal has a higher precision than on an analog signal, the multiplication is often executed on a digital signal by using a complex multiplier.

FIG. 5 exemplifies an adaptive array antenna transmitting apparatus. As illustrated, this apparatus performs modulation on a transmission signal S by means of a baseband modulator 501, and then performs vector multiplication with different complex weight coefficients $W_1$, and $W_2$ by means of vector multipliers 502 and 503. The signals resulting from the multiplication are converted to analog signals by D/A (Digital-to-Analog) converters 504 to 507. The analog signals are subjected to orthogonal modulation by orthogonal modulators 508 and 509, and then filtered by band-pass filters 510 to 513. The filtered signals are amplified by power amplifiers 514 and 515 and are then transmitted from antennae A and B.

The orthogonal modulators 508 and 509 used in the above process have a modulation characteristic as shown in FIG. 6 with respect to the input signal level. The characteristic is such that the modulation precision becomes equal to or greater than $\beta$, which is a practical range, when the input signal level lies between $(\alpha-\Delta_1)$ and $(\alpha+\Delta_2)$, and the modulation precision becomes the highest when the input signal level is $\alpha$.

The adaptive array antenna transmitting apparatus transmits a signal multiplied by a complex weight coefficient $W_1$ antenna by antenna. When the amplitude $|W_m|$ of the complex weight coefficient is small, therefore, inputs to the orthogonal modulators become smaller, whereas when the amplitude $|W_m|$ of the complex weight coefficient is large, inputs to the orthogonal modulators become large. When the amplitude $|W_m|$ of the complex weight coefficient is too small or too large, therefore, inputs to the orthogonal modulators do not fall in the range from $(\alpha-\Delta_1)$to $(\alpha+\Delta_2)$, thereby reducing the modulation precision of the transmitting apparatus.

Accordingly, it is an object of the present invention to provide an adaptive array antenna transmitting apparatus with a high modulation precision.

SUMMARY OF THE INVENTION

To achieve the above object, a radio transmitting apparatus according to this invention is designed to properly operate orthogonal modulators by compensating the levels of input signals to the orthogonal modulators within the proper range. More specifically, the radio transmitting apparatus embodying this invention comprises a vector multiplication section for multiplying a transmission baseband modulation signal by a complex weight coefficient for directivity control; an orthogonal modulation section for performing orthogonal modulation on an output signal of the vector multiplication section; a gain control section for performing gain control on an input signal to the orthogonal modulation section based on a gain determined from the complex weight coefficient and a previously measured modulation precision characteristic of the orthogonal modulation section; and a transmission section for amplifying and transmitting an output of the orthogonal modulation section.

The gain control section may perform gain control on the output signal of the vector multiplication section, or may perform gain control on the complex weight coefficient to be input to the vector multiplication section. The transmission section amplifies the signal level attenuated by the gain control to a proper output. This permits a transmission output from each antenna to be kept at the proper level. The transmission output is optimized by performing gain control on a power amplifier in the transmission section with the reciprocal of the control gain for the input signal to the orthogonal modulation section.

If the gain control section is designed to perform gain control on a transmission signal of each code in a code division multiple access (CDMA) system, CDMA transmission can be carried out at the proper transmission level. In this case, transmission power control may be executed code by code. The gain for the transmission power amplifier to be used can be properly determined from factors, such as m antennae (m=1 to M), n users (n=1 to N), complex weight coefficients $W_{m,n}$, the modulation precision characteristic of the orthogonal modulation section and a transmission power control amount for each code.

Further, a radio transmitting apparatus according to another aspect of this invention is designed to temporarily acquire a control gain, and compensate an amount of shift from the input signal level which provides the optimal operation of each orthogonal modulator, to thereby set the control gain again. This can permit every orthogonal modulator to perform the optimal operation with respect to every input signal. When the control gain is set again, a signal of the proper level can be transmitted by carrying out transmission after performing gain control with the reciprocal of the re-set control gain in the transmission power amplifier.

DETAILED DESCRIPTION OF THE PREFERRED EMBODIMENTS

Radio transmitting apparatuses according to preferred embodiments of the present invention will now be described specifically with reference to the accompanying drawings. The following description will be given on the premise that transmitting apparatuses of those embodiments are used in CDMA radio communications and are adaptive array antenna transmitting apparatuses which carry out directivity transmission.

First Embodiment

Figure 1:
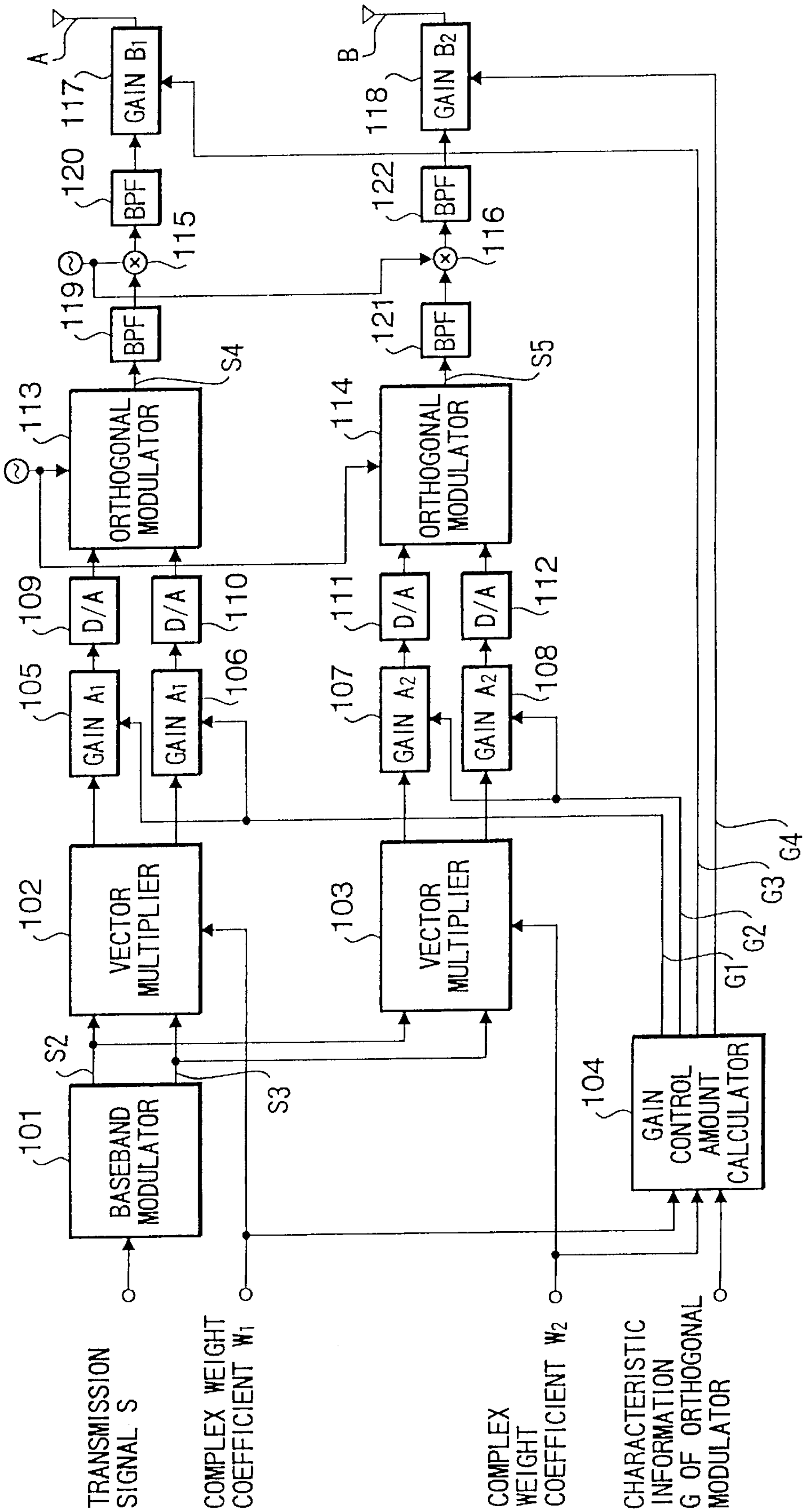
FIG. 1 is a block diagram of a radio transmitting apparatus according to a first embodiment of this invention.
Figure 6:
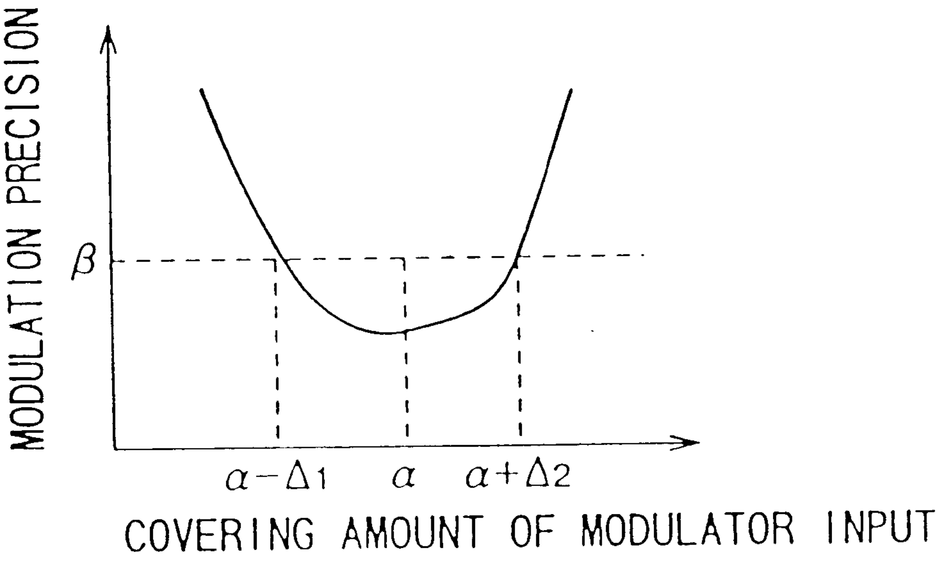
FIG. 6 is an explanatory diagram of the modulation characteristic of an orthogonal modulator.

FIG. 1 is a block diagram of a radio transmitting apparatus according to the first embodiment of this invention. Although the number of antennae is two to simplify the description, the fundamental operation is the same as in a case of using M antennae. In this embodiment, it is assumed that the input voltage v.s. modulation precision characteristic of an orthogonal modulator as shown in FIG. 6 has previously been measured and known. As there are M orthogonal modulators for M antennae, it is necessary to measure the characteristics of the individual orthogonal modulators in advance. A signal G which is the measured characteristic information of each orthogonal modulator is input to an associated gain controller.

First, a transmission signal S is input to a baseband modulator 101. The baseband modulator 101 modulates the signal S1 and outputs baseband modulation signals S2 and S3. Those signals S2 and S3 are respectively input to a vector multiplier 102 for an antenna A and a vector multiplier 103 for an antenna B. The vector multipliers 102 and 103 perform vector multiplication of the signals S2 and S3 by complex weight coefficients $W_1$ and $W_2$.

Gain controllers 105 and 106 perform gain control on the output signal of the vector multiplier 102 with a gain $A_1$ in accordance with a gain control signal G1 from a gain control amount calculator 104. Likewise, gain controllers 107 and 108 perform gain control on the output signal of the vector multiplier 103 with a gain $A_2$ in accordance with a gain control signal G2 from the gain control amount calculator 104.

D/A converters 109 to 112 convert those gain control signals to analog signals. Some of those analog signals are converted to an IF frequency signal S4 in an orthogonal modulator 113 by performing orthogonal modulation on the baseband signal of the antenna A, and the other analog signals are converted to an IF frequency signal S5 in an orthogonal modulator 114 by performing orthogonal modulation on the baseband signal of the antenna B.

Then, a mixer 115 converts the IF frequency signal S4 of the antenna A to a transmission frequency signal. A gain controller 117 as a power amplifier performs gain control on the transmission frequency signal with a gain $B_1$ in accordance with a gain control signal G3 from the gain control amount calculator 104, and transmits the resultant signal from the antenna A. Likewise, a mixer 116 converts the IF frequency signal S5 of the antenna B to a transmnission frequency signal. A gain controller 118 as a power amplifier performs gain control on the transmission frequency signal with a gain $B_2$ in accordance with a gain control signal G4 from the gain control amount calculator 104, and transmits the resultant signal from the antenna B.

Note that BPFs (Band-Pass Filters) 119 and 121 before the mixers 115 and 116 are frequency filters for removing unnecessary signals after orthogonal modulation, and BPFs 120 and 122 following the mixers 115 and 116 are frequency filters for removing unnecessary signals after signal mixing.

The gain control amount calculator 104 computes the gains $A_1$ and $B_1$ in the gain control for the antenna A and the gains $A_2$ and $B_2$ in the gain control for the antenna B as follows.

For the antenna A, the gain control amount calculator 104 calculates the gains $A_1$ and $B_1$ based on the characteristic information of the orthogonal modulator 113 and the complex weight coefficient $W_1$. Assuming that the orthogonal modulator 113 is so adjusted that when the optimal input voltage value is $\alpha_1$ and $|W_1|=1$, the outputs of the D/A converters 109 and 110 become $\alpha_1$, the gain controller 104 performs control such that the gain $A_1$ becomes $1/|W_1|$. Because the transmission signal at the antenna output terminal should be multiplied by $|W_1|$, the gain $B_1$ becomes $|W_1|$ and is determined by an equation (1) given later.

Likewise, with regard to the antenna B, the gains $A_2$ and $B_2$ are calculated based on the characteristic information of the orthogonal modulator 114 and the complex weight coefficient $W_2$, and the gain $A_2$ becomes $1/|W_2|$ and $B_2$ becomes $|W_2|$ which is determined by the following equation (2 ).

With m denoting an antenna number, the equations (1) and (2) become as follows.

$$A_m=1/|W_m| \tag{1}$$

$$B_m=|W_m| \tag{2}$$

The equations (1) and (2) will now be discussed. As an example, QPSK (Quadrature Phase Shift Keying) modulation system is to be used. In the QPSK modulation system, mean transmission power becomes a value given by an equation (3) in which the first term indicates the power of a signal point (a, a) of the QPSK modulation system, the second term indicates the power of a signal point (a, −a) of the QPSK modulation system, the third term indicates the power of a signal point (−a, −a) of the QPSK modulation system, and the fourth term indicates the power of a signal point (−a, a) of the QPSK modulation system. The numbers of the signal points are $k_1$, $k_2$, $k_3$ and $k_4$, respectively, and the total number of signal points becomes K as shown in an equation (4).

In the QPSK modulation system, mean transmission power when the transmission signal is multiplied by a weight coefficient W before transmission becomes a value given by an equation (5). It is to be noted however that as the weight coefficient W is a complex number, a signal point in the QPSK modulation system is also expressed by a complex number. As apparent from the above, mean transmission power changes from the value given by the equation (3) to the double value given by the equation (5) by multiplying the power by the weight coefficient. As the power changes by a factor of $|W''|^2$, the amplitude changes by a factor of $|W|$.

$$\begin{aligned}\overline{P}_1 &= \frac{k_1}{K}(a^2+a^2)+\frac{k_2}{K}\{a^2+(-a)^2\}+\frac{k_3}{K}\{(-a)^2+(-a)^2\}+\\ &\quad \frac{k_4}{K}\{(-a)^2+a^2\}\\ &= \frac{(k_1+k_2+k_3+k_4)}{K}2a^2\\ &= 2a^2\end{aligned} \tag{3}$$

$$k_1+k_2+k_3+k_4=K \tag{4}$$

-continued $$\begin{aligned}\overline{P}_2 &= \frac{k_1}{K}\left|\sqrt{2}\,a\exp(j\pi/4)\times w\right|^2 + \frac{k_2}{K}\left|\sqrt{2}\,a\exp(j\pi/4)\times w\right|^2 + \\ &\quad \frac{k_3}{K}\left|\sqrt{2}\,a\exp(j3\pi/4)\times w\right|^2 + \frac{k_4}{K}\left|\sqrt{2}\,a\exp(j3\pi/4)\times w\right|^2 \\ &= \frac{k_1}{K}2a^2|w|^2 + \frac{k_2}{K}2a^2|w|^2 + \frac{k_3}{K}2a^2|w|^2 + \frac{k_4}{K}2a^2|w|^2 \\ &= \frac{(k_1+k_2+k_3+k_4)}{K}2a^2|w|^2 \\ &= 2a^2|w|^2\end{aligned} \tag{5}$$

As apparent from the above, the radio transmitting apparatus embodying this invention performs gain control $A_m$ on the input signal to each orthogonal modulator and performs gain control $B_m$ to return the signal level to the original signal level before transmission, so that the level of the input signal to the orthogonal modulator lies within a range from $(\alpha-\Delta_1)$ to $(\alpha+\Delta_2)$, thereby ensuring high-output transmission while allowing the orthogonal modulator to operate with the optimal precision.

Second Embodiment

Figure 2:
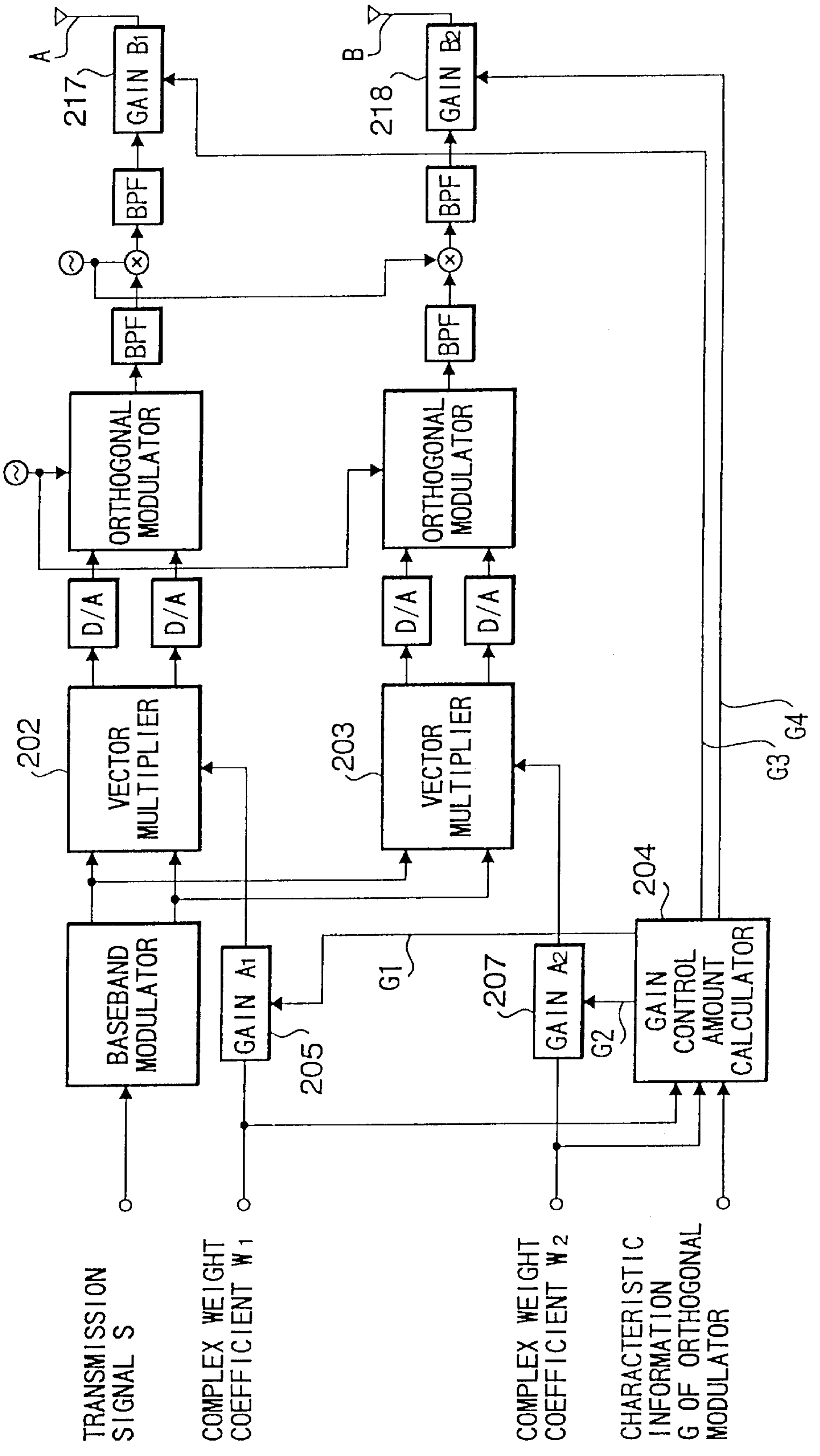
FIG. 2 is a block diagram of a radio transmitting apparatus according to a second embodiment of this invention.

FIG. 2 presents a block diagram of a radio transmitting apparatus according to the second embodiment of this invention. While the gain controllers 105 and 106, located before the associated D/A converters, carry out gain control with the gains $A_1$ and $A_2$ in the first embodiment, gain controllers 205 and 207 carry out gain control on complex weight coefficients $W_1$ and $W_2$ to be input to vector multipliers 202 and 203, with the gains $A_1$ and $A_2$ in the second embodiment.

The gain controller 205 executes gain control by dividing the complex weight coefficient $W_1$ by control information G1 from a gain control amount calculator 204. Likewise, the gain controller 207 executes gain control by dividing the complex weight coefficient $W_2$ by control information G2 from the gain control amount calculator 204.

Further, a gain controller 217 as a power amplifier performs gain control on the transmission signal of the antenna A with a gain $B_1$ in accordance with a gain control signal G3 from the gain control amount calculator 204, and a gain controller 218 as a power amplifier performs gain control on the transmission signal of the antenna B with a gain $B_2$ in accordance with a gain control signal G4 from the gain control amount calculator 204 as per the first embodiment.

Given that m is an antenna number, the gains $A_1$ and $A_2$ and the gains $B_1$ and $B_2$ in the gain controllers 205, 207, 217 and 218 are determined by the following equations (6) and (7).

$$A_m=1/|W_m| \tag{6}$$

$$B_m=|_m| \tag{7}$$

According to the second embodiment, as apparent from the above, gain control is previously performed on the complex weight coefficients $W_1$ and $W_2$, so that the processes in the vector multipliers 202 and 203 need not alter the amplitude and have only to rotate the phase. It is thus possible to set the range for an input signal to an orthogonal modulator constant with a simple circuit structure.

Third Embodiment

Figure 3A:
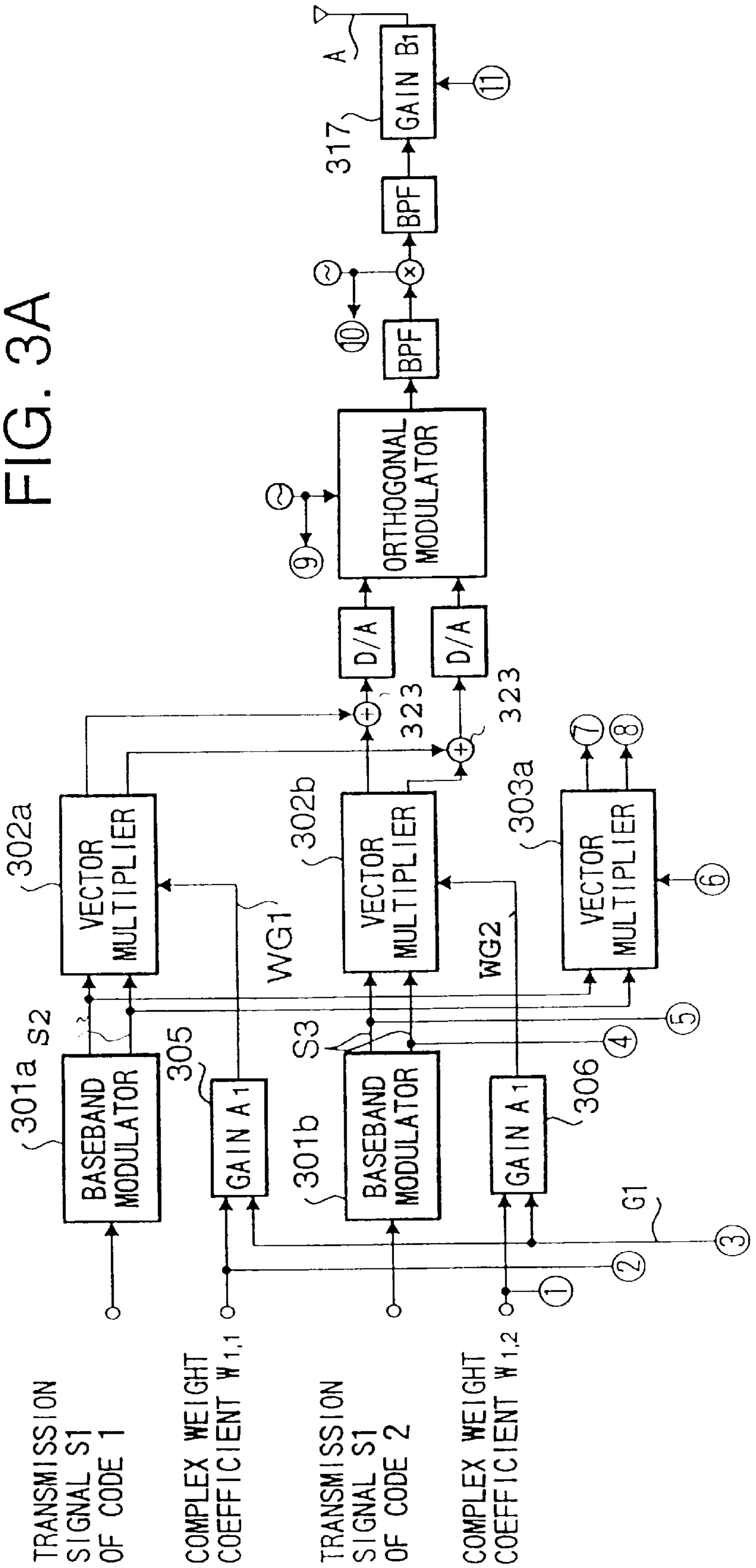
FIGS. 3A and 3B are block diagrams of a radio transmitting apparatus according to a third embodiment of this invention.
Figure 3B:
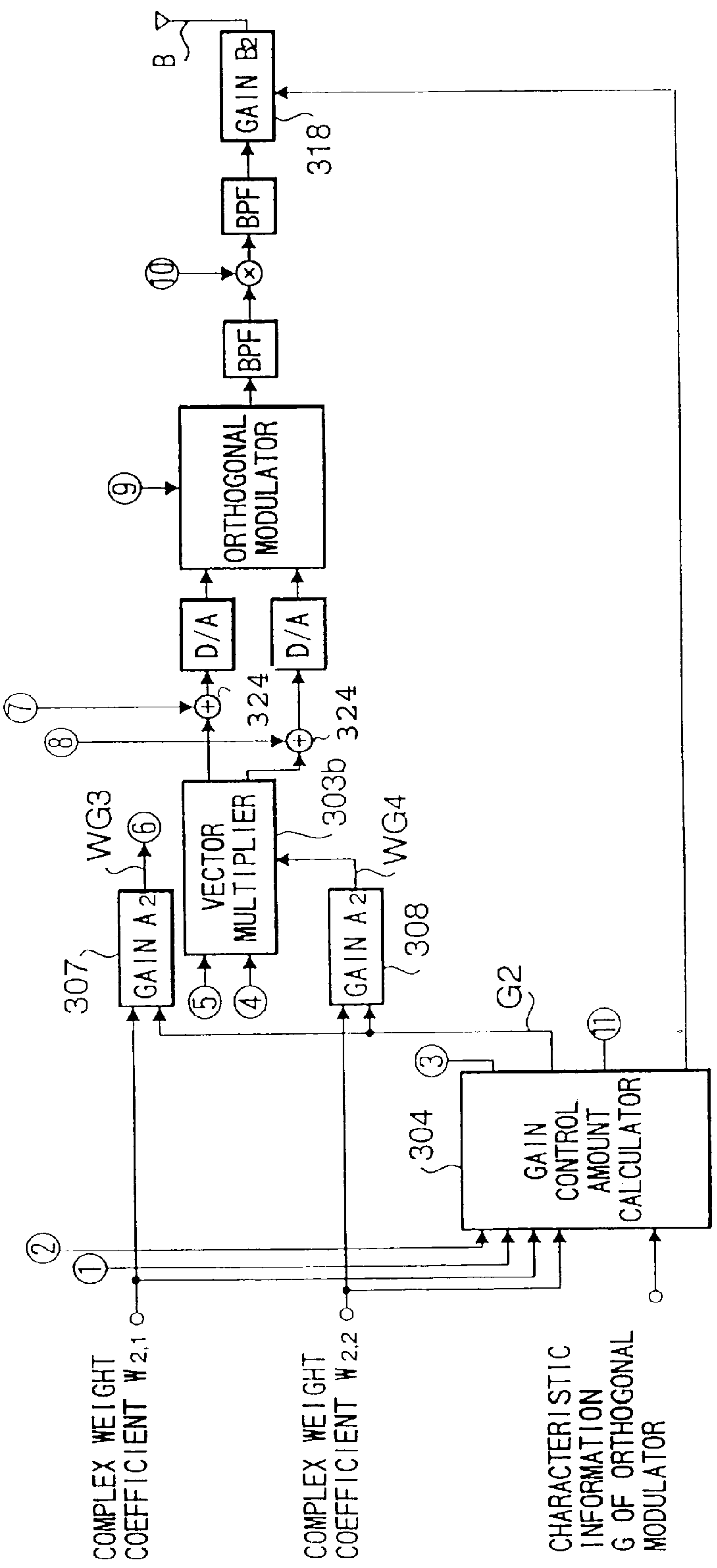

FIGS. 3A and 3B present a block diagram of a radio transmitting apparatus according to the third embodiment of this invention. The description of this embodiment will discuss an adaptive array antenna transmitting apparatus of a multiple code CDMA communications system. To simplify the description, we let the number of antennae be two and the number of codes be two. In the description, a complex weight coefficient for a code n for the antenna m is generally denoted by $W_{m,n}$.

Radio transmitting apparatuses according to the third and subsequent embodiments execute gain control by compensating the amplitude of a complex weight coefficient as per the second embodiment. The gain control scheme in the third embodiment may however employ either the gain control performed directly before a D/A converter after the execution of vector multiplication as done in the first embodiment or the scheme of compensating the amplitude of a complex weight coefficient which is used in vector multiplication as done in the second embodiment.

First, baseband modulators 301*a* and 301*b* receive a transmission signal S1 and arranges it at signal points for transmission. Then, the baseband modulator 301*a* sends a baseband modulation signal S2 of a code 1 to a vector multiplier 302*a* for the antenna A and a vector multiplier 303*a* for the antenna B. Likewise, the baseband modulator 301*b* sends a baseband modulation signal S3 of a code 2 to a vector multiplier 302*b* for the antenna A and a vector multiplier 303*b* for the antenna B.

Next, gain controllers 305 and 306 perform gain control on complex weight coefficients $W_{1,1}$ and $W_{1,2}$ of the code 1 and code 2 to be transmitted from the antenna A in accordance with a control signal G1 from a gain control amount calculator 304, and send the gain-controlled complex weight coefficients $W_{1,1}$, and $W_{1,2}$ to the vector multipliers 302*a* and 302*b*. Gain controllers 307 and 308 perform gain control on complex weight coefficients $W_{2,1}$ and $W_{2,2}$ of the code 1 and code 2 to be transmitted from the antenna B in accordance with a control signal G2 from the gain control amount calculator 304, and send the gain-controlled complex weight coefficients $W_{2,1}$ and $W_{2,2}$ to the vector multipliers 303*a* and 303*b*.

The vector multipliers 302*a*, 302*b*, 303*a* and 303*b* perform vector multiplication of the baseband modulation signals S2 and S3 and the gain-controlled complex weight coefficients WG1, WG2, WG3 and WG4.

Next, an adder 323 adds the outputs of the vector multipliers 302*a* and 302*b* of two separate systems, which become the transmission signals from the antenna A. An adder 324 adds the outputs of the vector multipliers 303*a* and 303*b* of two separate systems, which become the transmission signals from the antenna B. Gain controllers 317 and 318, which are power amplifiers, up-convert the D/A converted signals of those added signals to the transmission frequency band before transmission from the antennae A and B as done in the first embodiment. At this time, the control gain $B_m$ of the gain controllers 317 and 318 is determined by the gain control amount calculator 304 based on the following equation (8).

When the number of codes is two, the estimated value of a change in mean value of the inputs to the orthogonal modulators for the antenna 1 becomes larger by a factor given below.

$$\sqrt{|W_{1,1}|^2+|W_{1,2}|^2} \tag{8}$$

With the QPSK modulation system taken as an example, the equation (8) will be discussed. The transmission signal is what is obtained by adding a signal of the code 1 multiplied by the complex weight coefficient $W_{1,1}$ and a signal of the code 2 multiplied by the complex weight coefficient $W_{1,2}$. Given that the amplitude is $\sqrt{2}\times a$, the phase becomes π/4, 3π/4, 5π/4 and 7π/4, so that there are four QPSK signal points for the code 1 or 11=0, 1, 2, 3, and there are also four QPSK signal points for the code 2 or 12=0, 1, 2, 3. Four QPSK signal points for each code thus amount to a total of sixteen points.

Assuming that there are multiple signals and those sixteen points will occur with an equal probability, the mean power is calculated from an equation (9). This equation is derived by using such a property that the combinations (11, 12) of the phases of the code 1 and the code 2 will occur equally likely with a probability of 1/16. It is apparent that the computation result differs from the value of the mean power when the weight coefficients shown in the equation (3) are not used. Thus, a change in amplitude takes a value given by the equation (9).

As obvious from the above, it is possible to estimate a mean value by a simple method without actually calculating the mean value of transmission power for every transmission signal.

Although the foregoing description has been given of the PSK (Phase Shift Keying) modulation system, this invention can also be applied to the APSK (Amplitude Phase Shift Keying) modulation system and QAM (Quadrature Amplitude Modulation) system.

$$\begin{aligned}\overline{P}_3 &= \frac{1}{16}\sum_{l_1=0}^{3}\sum_{l_2=0}^{3}\left|\sqrt{2}\,a\exp j(l_1\pi/2+\pi/4)\times w_{1,1} + \sqrt{2}\,a\exp j(l_2\pi/2+\pi/4)\times w_{1,2}\right|^2 \\ &= \frac{2a^2}{16}\sum_{l_1=0}^{3}\sum_{l_2=0}^{3}|\exp j(l_1\pi/2)\times w_{1,1} + \exp j(l_2\pi/2)\times w_{1,2}|^2 \\ &= 2a^2(|w_{1,1}|^2+|w_{1,2}|^2)\end{aligned} \tag{9}$$

In the third embodiment, therefore, the gain controllers 305 and 306 perform gain control using the gains $A_1$ which are acquired by respectively dividing the complex weight coefficient $W_{1,1}$ of the code 1 for the antenna A to the vector multiplier 302*a* and the complex weight coefficient $W_{1,2}$ of the code 2 to the vector multiplier 302*b* by an equation (10).

$$\sqrt{|W_{1,1}|^2+|W_{1,2}|^2} \tag{10}$$

Accordingly, transmission is executed after amplifying the gain $B_1$ by an amount given by an equation (11) in the gain controller 317.

$$\sqrt{|W_{1,1}|^2+|W_{1,2}|^2} \tag{11}$$

Likewise, gain control is executed using the gains $A_2$ which are acquired by respectively dividing the complex weight coefficient $W_{2,1}$ of the code 1 for the antenna B to the vector multiplier 303*a* and the complex weight coefficient $W_{2,2}$ of the code 2 to the vector multiplier 303*b* by an equation (12).

$$\sqrt{|W_{2,1}|^2+|W_{2,2}|^2} \tag{12}$$

Accordingly, transmission is executed after amplifying the gain $B_2$ by an amount given by an equation (13) in the gain controller 318.

$$\sqrt{|W_{2,1}|^2+|W_{2,2}|^2} \tag{13}$$

Given that with regard to the m-th antenna in M antennae, $A_m$ denotes the gain of gain control $A_{m,1}$ for the code 1 and gain control $A_{m,2}$ for the code 2 and $B_m$ denotes the gain of the gain controllers 317 and 318, those gains can generally be expressed by the following equations (14) and (15).

$$A_m = 1\Big/\sqrt{|W_{m,1}|^2+|W_{m,2}|^2} \tag{14}$$

$$B_m = 1/A_m \tag{15}$$

Through the formation in the case where the number of antennae is M and the number of codes is N, mean power is added with the power of the weight coefficient. Thus, the input to an orthogonal modulator becomes the square root of the added result.

The control gains $A_m$ and $B_m$ are respectively expressed by the following equations (16) and (17).

$$A_m = 1\Big/\sqrt{\sum_{n=1}^{N}|W_{m,n}|^2} \tag{16}$$

$$B_m = 1/A_m \tag{17}$$

As apparent from the above, the third embodiment is adapted to an adaptive array antenna transmitting apparatus which transmits multiple codes of the CDMA communications system in a multiplexed form. The radio transmitting apparatus of the third embodiment executes gain control in consideration of the increase in mean value which has resulted from the multiplication by the weight coefficient, so that all the orthogonal modulators can perform the optimal operation with respect to every input signal.

Fourth Embodiment

The radio transmitting apparatus of the third embodiment performs gain control to keep the input to each orthogonal modulator constant by multiplying the complex weight coefficient $W_{m,n}$ of a code n for every m antennae by the coefficient shown in the equation (16). That is, the complex weight coefficient of each complex multiplier becomes what is given by an equation (18).

$$W'_{m,n} = W_{m,n}\Big/\sqrt{\sum_{n=1}^{N}|W_{m,n}|^2} \tag{18}$$

In the actual hardware, however, the number of bits of a multiplier is finite. When the amplitude of the complex weight coefficient in the equation (18) is too large, therefore, the complex multiplier overflows so that the accurate operation result cannot be obtained. When the amplitude of the complex weight coefficient is too small, on the other hand, the complex multiplier underflows, disabling the acquisition of the accurate operation result.

It is thus necessary to avoid overflowing and underflowing of the complex multiplier by compensating the value given by the equation (18). The compensation for the equation (18) is to acquire the desired modulation precision based on the previously measured characteristic of each orthogonal modulator. Through this compensation, an orthogonal modulator having the characteristic as shown in FIG. 6 properly operates within the input range from $(\alpha-\Delta_1)$ to $(\alpha+\Delta_2)$.

As the circuit structure of the radio transmitting apparatus of the fourth embodiment is the same as that of the third embodiment except for the operation of the gain control amount calculator 304, the description will be given with reference to FIGS. 3A and 3B. The gain control amount calculator 304 determines the gain control information G1 and G2 from the characteristic information G of the orthogonal modulators and complex weight coefficients $W_{1,1}$, $W_{1,2}$, $W_{2,1}$ and $W_{2,2}$ using the equation (14).

Then, the gain controllers 305, 306, 307 and 308 compute the values of the above individual complex weight coefficients in accordance with the equation (18). In accordance with which one of conditions (1) to (3) the computation results fall, the gain controllers 305, 306, 307 and 308 recalculate the gain control information G1 and G2.

Condition (1): The case where there is an overflowing coefficient among the entire compensated complex weight coefficients for the m-th antenna.

The complex weight coefficients are determined by an equation (19). Thus, the control gain is set to the values that are given by equations (20) and (21). Those equations mean compensation to make the mean value of the inputs to the orthogonal modulators to $(\alpha-\Delta_1)$. This compensation increases the complex weight coefficients by a factor of $(\alpha-\Delta_1)/\alpha$when the mean value of the inputs to the orthogonal modulators is set to $\alpha$. Therefore, the complex weight coefficients do not overflow and the modulation precision does not get lower. When the complex weight coefficients are too large to compensate overflowing through the above process, the complex weight coefficients are set to a maximum but non-overflowing value.

$$W''_{m,n} = \frac{\alpha-\Delta_1}{\alpha} W'_{m,n} \tag{19}$$

$$A_m = \frac{1}{\sqrt{\sum_{n=1}^{N} |W_{m,n}|^2}} \times \frac{\alpha-\Delta_1}{\alpha} \tag{20}$$

$$B_m = 1/A_m \tag{21}$$

Condition (2): The case where there is an underflowing coefficient among the entire compensated complex weight coefficients for the m-th antenna.

The complex weight coefficients are determined by an equation (22). Thus, the control gain is determined by equations (23) and (24).

Those equations mean compensation to make the mean value of the inputs to the orthogonal modulators to $(\alpha+\Delta_2)$. This compensation increases the complex weight coefficients by a factor of $(\alpha+\Delta_2)/\alpha$when the mean value of the inputs to the orthogonal modulators is set to $\alpha$. Therefore, the complex weight coefficients do not overflow and the modulation precision does not get lower. When the complex weight coefficients are too small to compensate underflowing through the above process, the complex weight coefficients are set to a minimum value of “1” which does not underflow.

$$W''_{m,n} = \frac{\alpha+\Delta_2}{\alpha} W'_{m,n} \tag{22}$$

$$A_m = \frac{1}{\sqrt{\sum_{n=1}^{N} |W_{m,n}|^2}} \times \frac{\alpha+\Delta_2}{\alpha} \tag{23}$$

$$B_m = 1/A_m \tag{24}$$

Condition (3): The case where none of the compensated complex weight coefficients for the m-th antenna overflow or underflow.

The complex weight coefficients are not compensated and the control gain is determined by equations (25) and (26).

$$A_m = 1 \bigg/ \sqrt{\sum_{n=1}^{N} |W_{m,n}|^2} \tag{25}$$

$$B_m = 1/A_m \tag{26}$$

As the output of an orthogonal modulator is multiplied by $(\alpha-\Delta_1)/\alpha$ or $(\alpha+\Delta_2)/\alpha$, the proper signal level can be acquired by increasing the gain by a factor of $\alpha/(\alpha-\Delta_1)$ in any gain controller serving as a power amplifier at the time of transmission.

When the amplitude of any complex weight coefficient overflows or underflows, the radio transmitting apparatus of the fourth embodiment can always keep the level of the input signal to the associated orthogonal modulator in the proper range by recomputing the control gain.

Fifth Embodiment

In radio transmission, in some case, the gain of a transmission power amplifier is reduced to suppress 26 undesired interference or reduce the amount of power used, or is increased to retain the line quality. This control is generally called transmission power control. The fifth embodiment is directed to an adaptive array antenna transmitting apparatus which performs transmission power control.

Figure 4A:
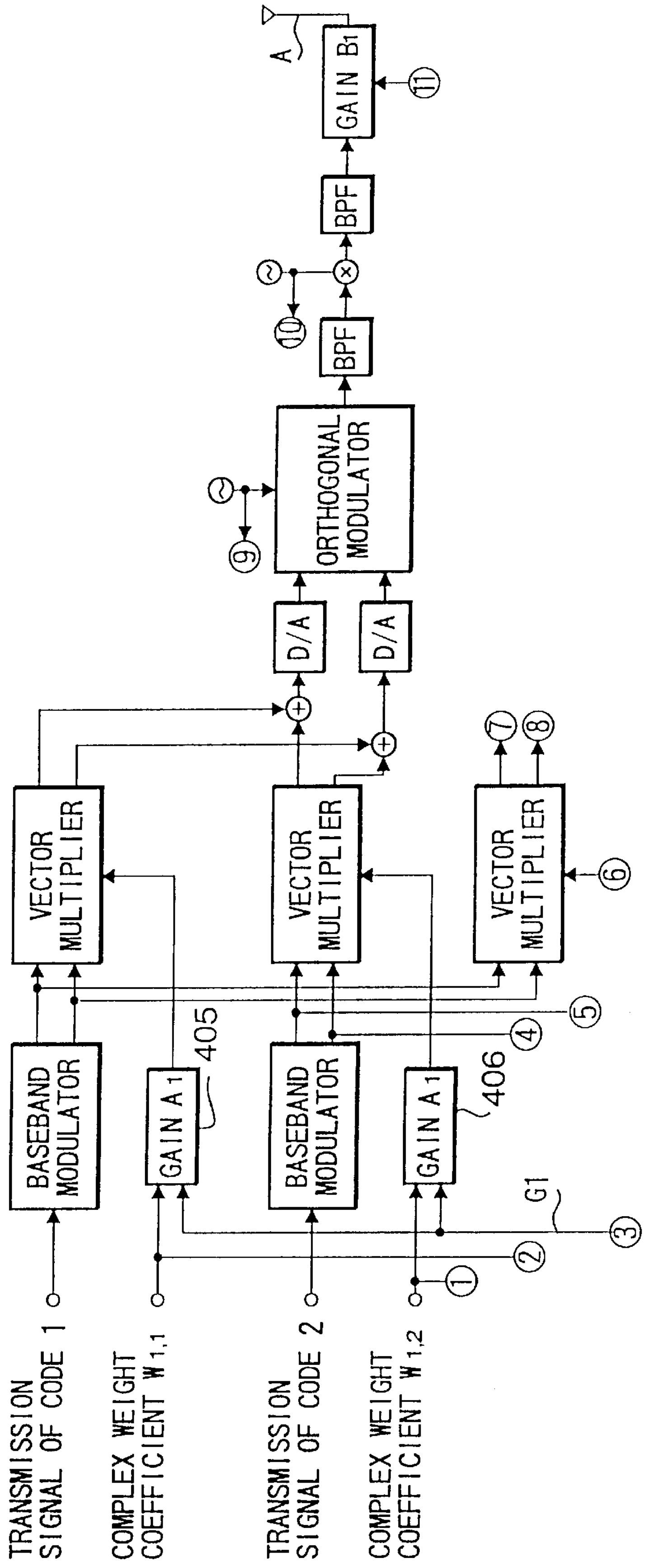
FIGS. 4A and 4B are block diagrams of a radio transmitting apparatus according to a fifth embodiment of this invention.
Figure 4B:
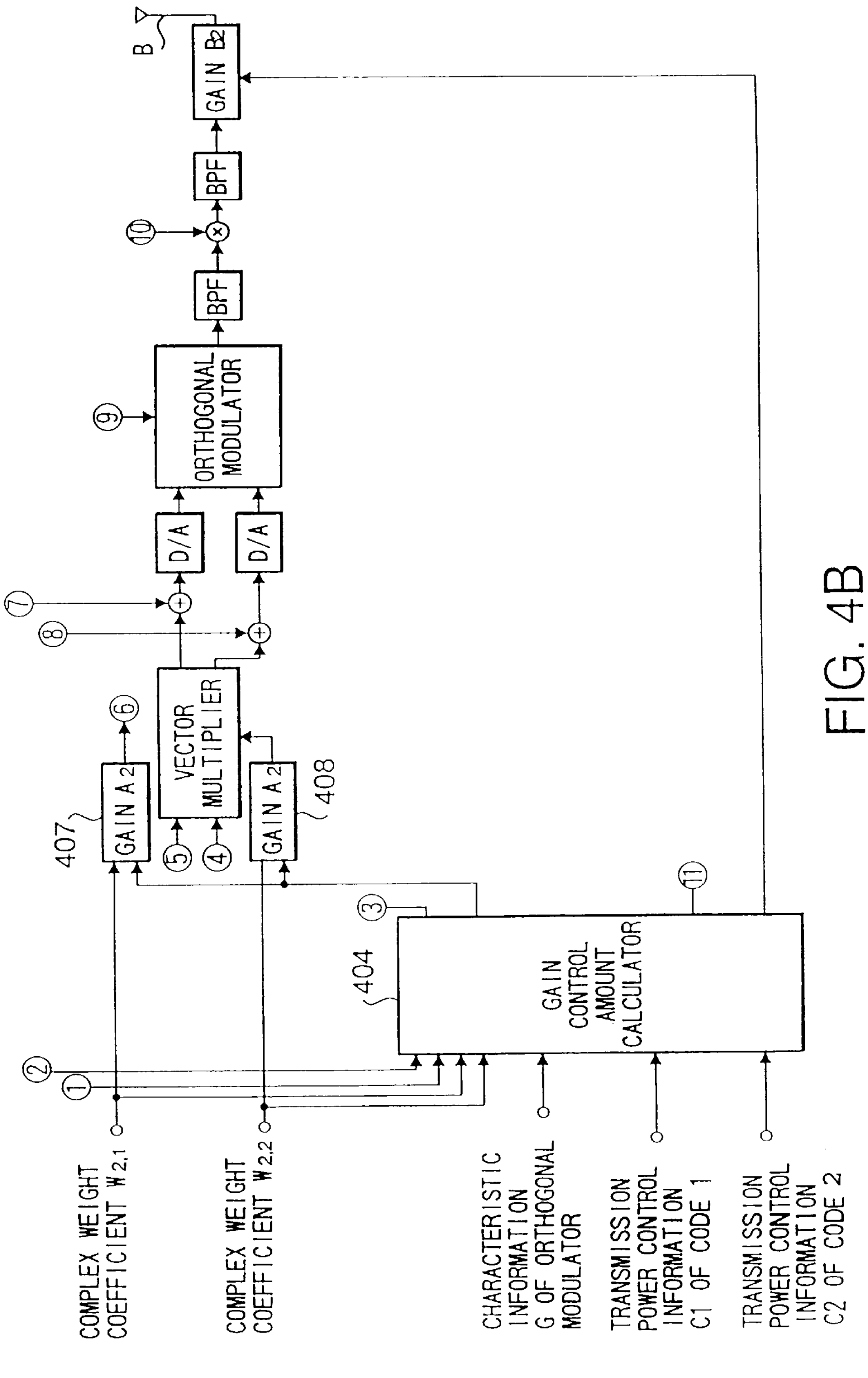
Figure 5:
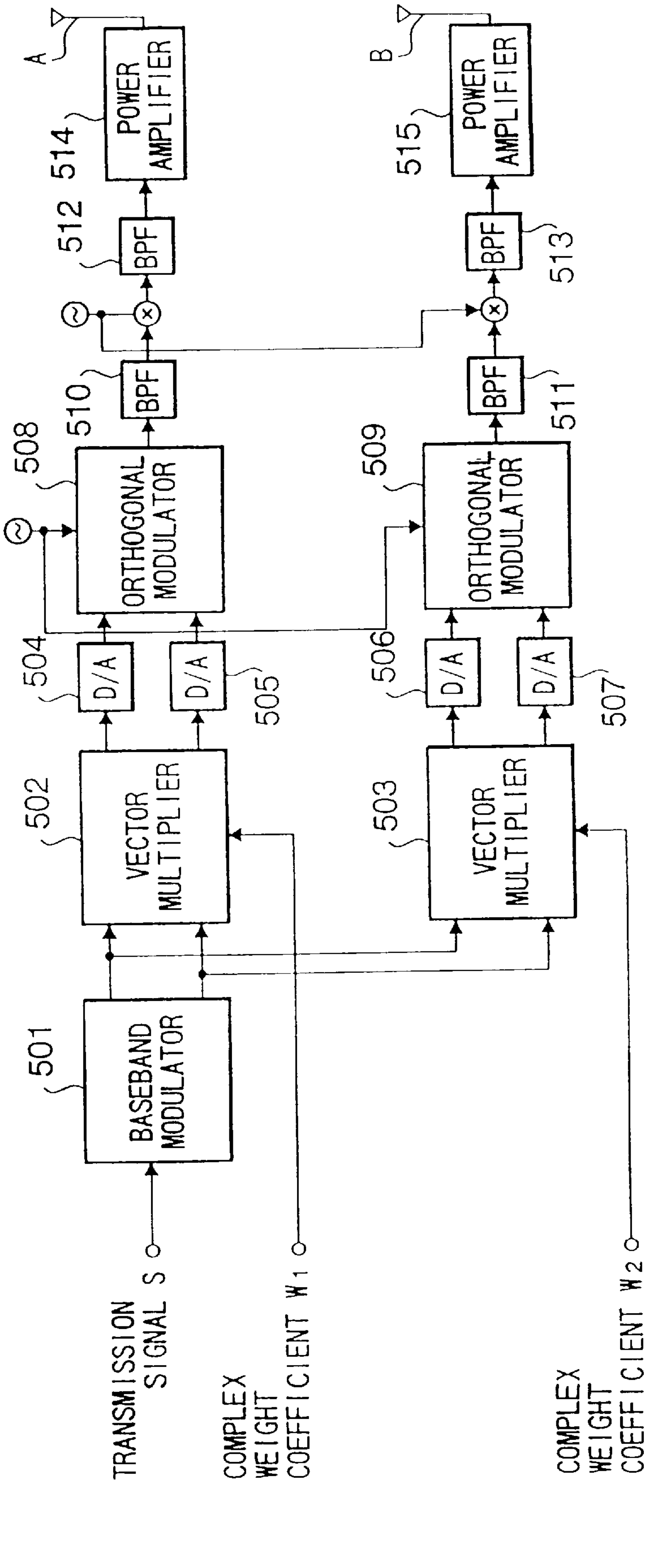
FIG. 5 is a block diagram of a conventional radio transmitting apparatus.

FIGS. 4A and 4B are block diagrams of a radio transmitting apparatus according to the fifth embodiment. This radio transmitting apparatus is the same as that of the third embodiment except for the operation of a gain control amount calculator 404.

The gain control amount calculator 404 receives the characteristic information G of orthogonal modulators, the complex weight coefficients $W_{1,1}W_{1,2}$, $W_{2,1}$ and $W_{2,2}$, the transmission power control information C1 of the code 1 and the transmission power control information C2 of the code 2. Then, the gain control amount calculator 404 determines gain control information G1 and G2 to gain controllers 405 and 406 using an equation (28) given below and determines gain control information G3 and G4 to gain controllers 407 and 408 using an equation (29) given below.

Because the transmission power control is carried out code by code, with Cn denoting a transmission power control amount, the control information consists of the complex weight coefficient $W_{m,n}$ and transmission power Cn with respect to the antenna m and code n. In this case, the input to each orthogonal modulator is increased by an amount shown in equation (27).

$$\sqrt{\sum_{n=1}^{N}|C_n W_{m,n}|^2} \tag{27}$$

Therefore, the gain controllers 405, 406, 407 and 408 perform gain control on the complex weight coefficients, antenna by antenna, with the gain control amount $A_m$ given by an equation (28), and any gain controller serving as a transmission power amplifier executes gain control with the gain control amount $B_m$ given by an equation (29).

$$A_m = 1\Big/\sqrt{\sum_{n=1}^{N}|C_n W_{m,n}|^2} \tag{28}$$

$$B_m = \sqrt{\sum_{n=1}^{N}|C_n W_{m,n}|^2} \tag{29}$$

When a complex weight coefficient which has undergone amplitude compensation shown in the equation (28) is so large that the associated complex multiplier overflows, or when is so small that the associated complex multiplier underflows, the compensation as illustrated in the section of the fourth embodiment is executed.

As apparent from the above, the radio transmitting apparatus of the fifth embodiment compensates for a variation in orthogonal modulator input which occurs as the transmission power control is carried out code by code. Even in executing transmission power control in adaptive array antenna transmission, therefore, transmission can be carried out with the proper precision maintained in the multiplication of weight coefficients for adaptive array antenna transmission while the orthogonal modulators are operated with the proper precision.

Sixth Embodiment

The radio transmitting apparatuses of the above-described embodiments controls gain controllers serving as power amplifiers with the control gain $B_m$. Power amplifiers however cannot follow up a variation in control gain $B_m$ rapidly depending on their operational characteristics. The sixth embodiment is designed to overcome this shortcoming.

As the circuit structure of the radio transmitting apparatus according to the sixth embodiment is the same as that of the first embodiment except for the operation of the gain control amount calculator 104, the description will be given with reference to FIG. 1.

The gain control amount calculator 104 receives the characteristic information G of the orthogonal modulators and complex weight coefficients $W_{1,1}$ and $W_{1,2}$, and calculates temporary control gain amounts G1, G2, G3 and G4 based on the equations (3) and (4).

Then, the calculated temporary gain control amounts of the individual antennae and the followability of each power amplifier are determined.

The first one of the determination procedures is to set the gain control amount which the associated power amplifier can follow up as a threshold value. Then, when the computed gain control amount is less than the threshold value, it is determined that the power amplifier can follow up the gain control amount. When the computed gain control amount is equal to or greater than the threshold value, on the other hand, it is determined that the power amplifier cannot follow up the gain control amount.

Specifically, the value of the gain control amount $B_m$ is compared with the threshold value P of the gain control amount based on which the followability of the associated power amplifier is to be determined. When the gain control amount $B_m$ is smaller than the threshold value P, it means that the power amplifier can follow up the amount, so that the gain control amount calculator 104 sets the gain of the power amplifier to the gain control amount $B_m$ and operates the power amplifier with that gain. When the gain control amount $B_m$ is greater than the threshold value P based on which the followability of the associated power amplifier is to be determined, it means that the power amplifier cannot follow up the amount, so that the gain control amount calculator 104 sets the gain of the power amplifier to the followable threshold value P and operates the power amplifier with that gain.

That is, when $B_m \leqq P$, $B_m$ is used directly and $A_m=1/B_m$, and when $B_m=P$, $B_m=P$ and $A_m=1/P$.

The radio transmitting apparatus of the sixth embodiment, as obvious from the above, sets the control gain of each vector multiplier while giving some relativity with the control gain of the associated power amplifier. The gain control amount calculator 104 compensates the gain control characteristic of the power amplifier by setting the control gain $B_m$ of the power amplifier step by step, and re-setting the value of the control gain $A_m$ of the vector multiplier in association with the control gain $B_m$ of the power amplifier.

What is claimed is:

1. A radio transmitting apparatus comprising:

vector multiplication means for multiplying a transmission baseband modulation signal by a complex weight coefficient for directivity control;

orthogonal modulation means for performing orthogonal modulation on an output signal of said vector multiplication means;

gain control means for performing gain control on an input signal to said orthogonal modulation means based on a gain determined from said complex weight coefficient and a previously measured modulation precision characteristic of said orthogonal modulation means; and transmission means for amplifying and transmitting an output of said orthogonal modulation means.

2. The radio transmitting apparatus according to claim 1, wherein said gain control means executes gain control on said output signal of said vector multiplication means.

3. The radio transmitting apparatus according to claim 1, wherein said gain control means performs gain control on said complex weight coefficient to be input to said vector multiplication means.

4. The radio transmitting apparatus according to claim 1, wherein said transmission means executes transmission after performing gain control on a reciprocal of a control gain with respect to an input signal to said orthogonal modulation means.

5. The radio transmitting apparatus according to claim 4, wherein said gain control means performs gain control on a transmission signal of each code in a code division multiple access (CDMA) system.

6. The radio transmitting apparatus according to claim 5, wherein for m antennae (m=1 to M), n users (n=1 to N) and complex weight coefficients $W_{m,n}$, said transmission means controls a gain of a power amplifier based on an estimated value of a change in a mean value of an input signal to said orthogonal modulation means which is determined by a mean square of a power of complex weight coefficients for N users.

7. The radio transmitting apparatus according to claim 5, wherein said gain control means performs gain control on an input signal to said orthogonal modulation means using a gain determined from said complex weight coefficient, said previously measured modulation precision characteristic of said orthogonal modulation means and a transmission power control amount for each code.

8. The radio transmitting apparatus according to claim 4, wherein said for m antennae (m=1 to M), n users (n=1 to N), complex weight coefficients $W_{m,n}$ and a transmission power control amount $C_n$, said transmission means controls a gain of a transmission power amplifier based on an estimated value of a change in a mean value of an input signal to said orthogonal modulation means which is determined by a mean square of a power of a product of complex weight coefficients for N users and a transmission power control amount.

9. A radio transmitting apparatus comprising:

vector multiplication means for multiplying a transmission baseband modulation signal by a complex weight coefficient for directivity control;

orthogonal modulation means for performing orthogonal modulation on an output signal of said vector multiplication means;

transmission means for amplifying and transmitting an output of said orthogonal modulation means; and gain control means for performing gain control on an input signal to said orthogonal modulation means based on a gain determined from said complex weight coefficient and a previously measured modulation precision characteristic of said orthogonal modulation means, whereby said gain control means executes gain compensation to increase a control gain based on an input level versus modulation precision of said orthogonal modulation means if said vector multiplication means underflows when using a complex weight coefficient after gain control, and executes gain compensation to decrease said control gain based on said input level versus modulation precision of said orthogonal modulation means if said vector multiplication means overflows when using said complex weight coefficient after gain control.

10. A gain control method for a radio transmitting apparatus comprising the steps of:

performing gain control on an input signal to an orthogonal modulator in such a way that a level of said input signal falls within a proper operation range of said orthogonal modulator;

performing orthogonal modulation on a gain-controlled signal; and executing transmission after performing gain control on a signal after orthogonal modulation with a reciprocal of a control gain for said input signal to said orthogonal modulator.

11. The gain control method according to claim 10, wherein said gain control step performs gain control on a signal resulting from vector multiplication of a transmission baseband modulation signal by a complex weight coefficient for directivity control.

12. The gain control method according to claim 10, wherein said gain control step performs gain control on a complex weight coefficient for directivity control, by which a transmission baseband modulation signal is to be multiplied.

13. The gain control method according to claim 11, wherein said gain control step includes the steps of:

determining if underflow or overflow occurs at a time of performing said vector multiplication; and compensating a control gain when underflow or overflow is determined to occur when using a complex weight coefficient after gain control.

* * * * *